United States Patent
Raeth et al.

(10) Patent No.: US 12,414,224 B2
(45) Date of Patent: Sep. 9, 2025

(54) INLET HEAT SINK FOR A COOLING SYSTEM OF A SUPERCOMPUTER ELECTRONIC BOARD

(71) Applicants: BULL SAS, Les Clayes-sous-Bois (FR); Le Commissariat à l'énergie atomique et aux énergies alternatives (CEA), Paris (FR)

(72) Inventors: Marc Raeth, Tacoignières (FR); Luc Dallaserra, Paris (FR)

(73) Assignees: BULL SAS, Les Clayes-sous-Bois (FR); Le Commissariat à l'énergie atomique et aux énergies alternatives (CEA), Paris (FR)

( * ) Notice: Subject to any disclaimer, the term of this patent is extended or adjusted under 35 U.S.C. 154(b) by 206 days.

(21) Appl. No.: 18/364,870

(22) Filed: Aug. 3, 2023

(65) Prior Publication Data
US 2024/0074029 A1  Feb. 29, 2024

(30) Foreign Application Priority Data
Aug. 31, 2022  (EP) .................................... 22306291

(51) Int. Cl.
*H05K 1/02*  (2006.01)
*H05K 7/20*  (2006.01)

(52) U.S. Cl.
CPC ....... *H05K 1/0203* (2013.01); *H05K 7/20254* (2013.01); *H05K 7/20263* (2013.01); *H05K 7/20272* (2013.01)

(58) Field of Classification Search
CPC ............. H05K 1/0203; H05K 7/20254; H05K 7/20263; H05K 7/20272; H05K 7/20772; G06F 2200/201; G06F 1/20
See application file for complete search history.

(56) References Cited

U.S. PATENT DOCUMENTS 10,481,652 B2 * 11/2019 Rice .................... H05K 7/20927
10,739,084 B2 *  8/2020 Tsai .................... H05K 7/20254
(Continued)

FOREIGN PATENT DOCUMENTS

CN    112015250 A  * 12/2020 ............. G06F 1/183
EP    2770810 B1    2/2014
(Continued)

OTHER PUBLICATIONS

Zhao Xi, "Server integral parallel flow cold plate liquid cooling system", Jan. 12, 2020, Chengdu Longwei System Tech Co Ltd, Entire Document (Translation of CN 112015250). (Year: 2020).*
(Continued)

*Primary Examiner* — Stephen S Sul
(74) *Attorney, Agent, or Firm* — ARC IP Law, PC; Joseph J. Mayo

(57) ABSTRACT

An inlet heat sink for a liquid cooling system of an electronic board, including a cold inlet connector, a hot outlet connector, and a cold outlet connector. An upper part of a cooling block being configured to divide a flow of incoming heat transfer fluid by the cold inlet connector into a first flow oriented to collect the heat generated by the electronic board by being routed to the hot outlet connector, and a second flow, oriented directly to the cold outlet connector.

10 Claims, 3 Drawing Sheets

(56) References Cited

U.S. PATENT DOCUMENTS

| | | |
|---|---|---|
| 11,452,237 B2* | 9/2022 | Tan .................... H05K 7/20272 |
| 2005/0128705 A1* | 6/2005 | Chu ...................... H01L 23/473 |
| | | 361/689 |
| 2014/0233175 A1* | 8/2014 | Demange ........... H05K 7/20254 |
| | | 361/699 |
| 2016/0118317 A1 | 4/2016 | Shedd et al. |
| 2018/0340744 A1 | 11/2018 | Tsai et al. |
| 2019/0387609 A1* | 12/2019 | Chen .................... H01L 23/473 |
| 2021/0076539 A1* | 3/2021 | Raeth ................. H05K 7/20254 |
| 2021/0307195 A1* | 9/2021 | Tian ........................ F28F 3/044 |
| 2023/0025167 A1* | 1/2023 | Gao .................. H05K 7/20254 |
| 2024/0074100 A1* | 2/2024 | Saksager ................. G06F 30/17 |

FOREIGN PATENT DOCUMENTS

| | | | |
|---|---|---|---|
| EP | 2770809 B1 | 4/2019 | |
| EP | 3500079 A1 | 6/2019 | |
| WO | 2019115963 A1 | 6/2019 | |
| WO | WO-2022192031 A1 * | 9/2022 | ........... H05K 1/0203 |

OTHER PUBLICATIONS

Search Report issued in EP22306291.0 on Feb. 8, 2023 (5 pages).

* cited by examiner

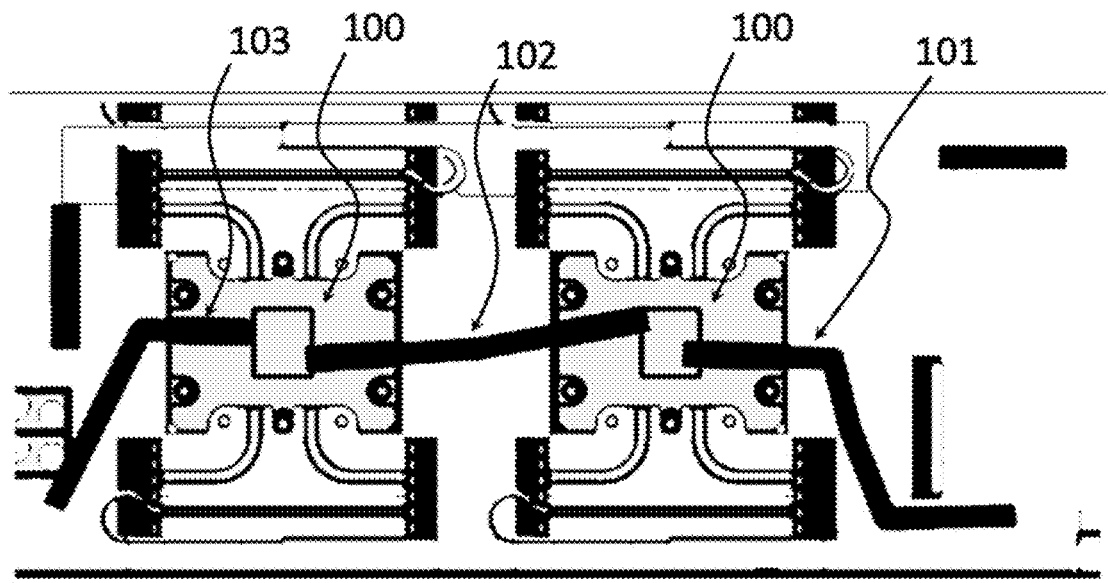
FIGURE 1 - Prior Art
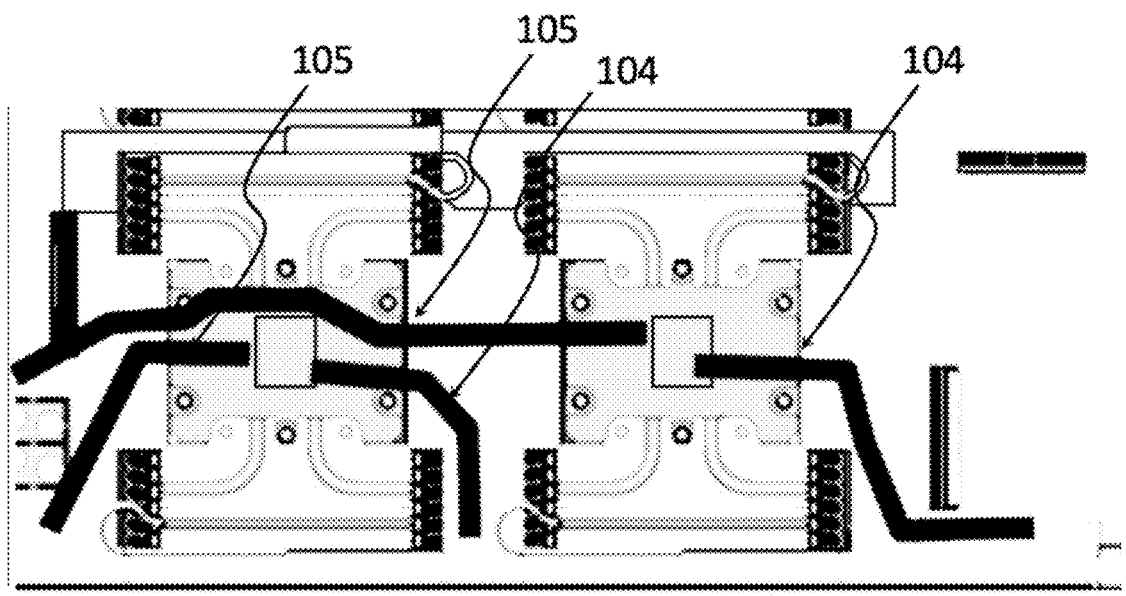
FIGURE 2 - Prior Art

INLET HEAT SINK FOR A COOLING SYSTEM OF A SUPERCOMPUTER ELECTRONIC BOARD

This application claims priority to European Patent Application Number 22306291.0, filed 31 Aug. 2022, the specification of which is hereby incorporated herein by reference.

BACKGROUND OF THE INVENTION

Technical Field of the Invention

At least one embodiment of the invention relates to the field of cooling computer processors and more particularly relates to a liquid cooling system of an electronic board comprising at least one computing processor.

Description of the Related Art

Server compute blades typically comprise electronic boards, in particular processors, which emit heat and therefore must be cooled. Initially, these electronic boards were cooled by air. However, in the case of rack-mountable servers, the air circulation is not sufficient to cool the electronic boards. To solve this problem, fluidic cooling systems have been developed.

Among the known electronic board cooling solutions, IBM® has developed a dual processor electronic board mixed cooling system for supercomputers. Such a system comprises copper pipes containing a heat transfer fluid forming a liquid loop. However, the rigidity of copper pipes does not allow quick disassembly from a single processor. In addition, the liquid loop ensures cooling of the processors only. The rest of the dissipated power is cooled by convection in the air, which is not optimal for the power usage effectiveness (PUE) of the supercomputer.

Other electronic board manufacturers offer liquid cooling systems dedicated solely to processors. The latter incorporate a heat sink, built-in pump and exchanger to extract the calories. Of course, such devices are not compatible with larger systems such as supercomputers due to space constraints.

The applicant has further developed a mixed cooling system wherein the electronic boards are cooled by means of a cold aluminum plate wherein a heat transfer fluid circulates, the cold plate being interfaced with all the low and middle electronic components to be cooled, i.e. all the components of an electronic board excluding the high electronic components (typically the processors and memory modules). Processors are the most constraining components to cool (because they must remain accessible) and also the most dissipative. They cannot be interfaced with the cold plate directly. To ensure thermal contact with the processors, each of them is interfaced with an intermediate heat sink with heat pipes. It is a phase-changed two-phase heat sink (usually referred to as "Heat Spreader CPU"), which conducts heat from the processors to the cold plate. The part of the heat pipes in contact with the copper slab that interfaces the processor constitutes the evaporator, while the part in contact with the interface with the cold plate constitutes the condenser. This solution is described in more detail in the European patent applications EP 2770809 and EP 2770810 belonging to the applicant.

This processor cooling solution using heat pipes also has disadvantages, and in particular:

specific heat pipe thermal limits: the flow inside a heat pipe is two-phase and is governed by five limits in terms of flow, viscosity, boiling, driving, capillarity, which depend on the dimensions of the heat pipes and the power to evacuate.

mechanical limits: the increase in the number of heat pipes results in an increase in the rigidity of the assembly. However, in order to compensate for tolerances, it is essential that the heat sink deforms sufficiently.

a high number of removable thermal interfaces: thermal contacts must be ensured between the cold plate and the heat sink on the one hand, and between the heat sink and the processor on the other. In the current solution implemented by the applicant, these thermal contacts are guaranteed by the use of conductive grease, which has the disadvantage of generating a high temperature gradient.

the complexity and cost of the overall solution: the solid/fluid exchange surfaces are currently at the cold plate. The complexity of the latter in terms of heat sinks considerably increases machining in the cold plate and hence the manufacturing cost.

To solve the aforementioned defects and disadvantages, the applicant has developed a cooling system for an electronic board that is fully liquid, comprising a cold plate supplied with heat transfer fluid via a water path internal to the cold plate, and a plurality of heat sinks connected in flexible connections with the water path internal to the cold plate. These flexible connections form a flexible network coupled to the network of rigid channels of the cold plate supplied with heat transfer fluid (typically glycol water), thus allowing the supply of heat transfer fluid to the heat sinks. This network is coupled with the cold plate system allowing cooling of the rest of the electronic board. In order to optimize the cooling of the processor as much as possible, the heat transfer fluid must be brought as close as possible to the heat source. To this end, the applicant has specifically developed a single-phase heat sink comprising a cooling block of heat-conducting material that may be supplied with heat transfer fluid. The heat source constituted by the processor will therefore be directly interfaced with this cooling block (also referred to in the examples by the term "waterblock") supplied with heat transfer fluid taken from the cold plate. Such an integrated cooling system meets the constraints of thermal efficiency, mechanical compactness and maintainability necessary for this type of high-performance computing equipment. This solution is described in detail in WO2019115963.

It is known that multi-processor computers require as many cooling blocks as processors.

For a given chain of components, in a known solution shown in FIG. 1, the heat exchangers 100 are mounted in series, i.e. the inlet of the first exchanger 100 is connected to a liquid inlet via an inlet hose 101, its outlet is connected to the inlet of the next exchanger 100 via a connecting hose 102 and so on up to the outlet of the last exchanger 100 which is connected to a liquid outlet via an outlet hose 103. As the exchangers are in series, the temperature of the liquid increases as it approaches the liquid outlet (the liquid is hotter when it arrives in the last exchanger as it has already been used to cool the previous exchangers) and therefore the components located at the end of the chain are less well cooled than those at the beginning of the chain. In addition, this solution makes component maintenance complicated, as all exchangers in a flexible connection must be removed to change a component in the chain, particularly beyond two exchangers in series.

In order to at least partially overcome these disadvantages, it is known to mount the exchangers 100 in parallel and no longer in series, as shown in FIG. 2. This means that each processor is cooled independently of the others and each cooling block may be easily changed in the event of a problem. However, this solution has the drawback of requiring as many connectors (not shown for clarity) and inlet hoses 104 as there are processors and as many connectors (not shown for clarity) and outlet hoses 105 as there are processors. However, the connectors and inlet hoses 104 and the connectors and outlet hoses 105 require a significant amount of space to be connected to the cold plate. However, in multi-processor computers, the lack of space may prove to be an obstacle to installing such a solution.

It would therefore be advantageous to propose a simple, reliable and effective solution to at least partially remedy these disadvantages.

BRIEF SUMMARY OF THE INVENTION

One purpose of at least one embodiment of the invention is therefore to provide a solution for cooling an electronic board, in particular of a supercomputer. For this purpose, at least one embodiment of the invention defines several types of complementary heat sinks each having a specific function as well as a cooling system comprising such heat sinks.

Thus, one or more embodiments of the invention relates firstly to an inlet heat sink for a liquid cooling system of an electronic board, the board including at least one electronic component, for example a processor, a voltage regulator or a memory module, for example mounted on a support, the system comprising a cold plate for receiving the heat sink, the cold plate being dimensioned to cover at least part of the electronic board, in particular the support of the at least one electronic component, where applicable, and including a cooling circuit comprising channels inside of which a "cold" heat transfer fluid for supplying at least the heat sink flow, and a discharge circuit comprising channels inside of which a "hot" heat transfer fluid having been heated through the heat sink flows, the heat sink comprising a cooling block made of heat-conducting material comprising a lower part constituting the main heat exchange zone and an upper part to be connected to the cold plate, the heat sink being remarkable in that it includes:
  a "cold" inlet connector fluidly connected to the upper part of the cooling block and which is to receive an inlet tube of the cooling circuit so that the cooling block is supplied by the heat transfer fluid from the cold plate,
  a "hot" outlet connector,
  a "cold" outlet connector,
  the upper part of the cooling block being configured to divide the incoming heat transfer fluid flow through the cold inlet connector into a first flow, which is oriented towards the lower part of the cooling block so as to collect the heat generated by the electronic board being routed to the hot outlet connector, and a second flow, oriented directly towards the cold outlet connector.

The inlet heat sink according to one or more embodiments of the invention thus makes it possible to keep part of the cold flow coming from the cold plate to direct it to another heat sink connected to its outlet, thus improving the cooling of the electronic component(s) (processor or other) located downstream in the direction of circulation of the heat transfer fluid. The inlet heat sink according to at least one embodiment of the invention further makes it possible to meet large-scale manufacturing constraints, due to its simplicity of manufacture.

At least one embodiment of the invention also relates to an outlet heat sink for a liquid cooling system of an electronic board, the board including at least one electronic component, for example a processor, a voltage regulator or a memory module, for example mounted on a support, the system including a cold plate for receiving the heat sink, the cold plate being dimensioned to cover at least part of the electronic board, in particular the support for the at least one electronic component, where applicable, and comprising a cooling circuit comprising channels inside of which a "cold" heat transfer fluid is circulating, for supplying the heat sink, and a discharge circuit comprising channels inside of which a "hot" heat transfer fluid is circulating, having been heated through the heat sink, the heat sink comprising a cooling block made of heat-conducting material comprising a lower part constituting the main heat exchange zone and an upper part intended to be connected to the cold plate, the heat sink being remarkable in that it includes:
  a "cold" inlet connector fluidly connected to the upper part of the cooling block and which is to receive a connecting tube of the cooling circuit so that the cooling block is supplied by the heat transfer fluid from the cold plate (through at least one heat sink),
  a "hot" inlet connector fluidly connected to the upper part of the cooling block and which is to receive a connecting tube of a flow of heated heat transfer fluid,
  a "hot" outlet connector,
  the upper part of the cooling block being configured to on the one hand route the flow of heat transfer fluid entering through the cold inlet connector to the lower part of the cooling block so as to collect the heat generated by the electronic board by being routed to the outlet connector, and on the other hand route the heated heat transfer fluid flow received on the hot inlet connector directly to the outlet connector where it merges with the heated flow in the lower part of the cooling block.

The outlet heat sink according to at least one embodiment of the invention thus allows both to receive a flow of cold heat transfer fluid and to merge the hot flows coming from both the lower part of the cooling block and an upstream heat sink connected to the hot inlet of the outlet heat sink, thus improving the cooling of the electronic component(s) associated with the outlet heat sink while allowing the circulation of the heat transfer fluid. The outlet heat sink according to one or more embodiments of the invention further makes it possible to meet large-scale manufacturing constraints, due to its simplicity of manufacture.

Advantageously, an inlet heat sink may be connected in pairs with an outlet heat sink to form an assembly of heat sinks according to at least one embodiment of the invention.

At least one embodiment of the invention also relates to an interlayer heat sink for a liquid cooling system of an electronic board, the board comprising at least one electronic component, for example a processor, a voltage regulator or a memory module, for example mounted on a support, the system comprising a cold plate for receiving the heat sink, the cold plate being dimensioned to cover at least part of the electronic board, in particular the support for the at least one electronic component, where applicable, and comprising a cooling circuit comprising channels inside of which a "cold" heat transfer fluid is circulating, for supplying at least the heat sink, and a discharge circuit comprising channels inside of which a "hot" heat transfer fluid is circulating, having been heated through the heat sink, the heat sink comprising a cooling block made of heat-conducting material comprising a lower part constituting the main heat exchange zone and an upper part intended to be connected to the cold plate, the heat sink wherein:

a "cold" inlet connector fluidly connected to the upper part of the cooling block and which is to receive an inlet tube of the cooling circuit so that the cooling block is supplied by the heat transfer fluid from the cold plate, a "hot" inlet connector fluidly connected to the upper part of the cooling block and which is to receive a connecting tube of a flow of heated heat transfer fluid, a "hot" outlet connector, a "cold" outlet connector, the upper part of the cooling block being configured to:

divide the flow of incoming heat transfer fluid through the cold inlet connector into a first flow, which is oriented towards the lower part of the cooling block so as to collect the heat generated by the electronic board by being routed to the hot outlet connector, and a second flow, oriented directly towards the cold outlet connector, route the flow of heated heat transfer fluid received on the hot inlet connector directly to the hot outlet connector where it merges with the heated flow in the lower part of the cooling block.

Thus, in at least one embodiment, one or more interlayer heat sinks may be connected between an inlet heat sink and an outlet heat sink of the same assembly of heat sinks in order to cool more electronic components on the same line while allowing a cold heat transfer fluid flow to the downstream heat sinks of the assembly.

At least one embodiment of the invention also relates to a liquid cooling system of an electronic board, the board comprising at least one electronic component, for example a processor, a voltage regulator or a memory module, for example mounted on a support, the system comprising a cold plate and at least one assembly of heat sinks, the cold plate being for receiving the assembly of heat sinks, being dimensioned to cover at least part of the electronic board, in particular the support of the at least one electronic component, where applicable, and comprising a cooling circuit comprising channels inside of which a "cold" heat transfer fluid is circulating, for supplying at least one of the heat sinks, and a discharge circuit comprising channels in which a "hot" heat transfer fluid having been heated through at least one of the heat sinks, each heat sink comprising a main heat exchange zone capable of bearing against one of the processors, each assembly of heat sinks comprising an inlet heat sink such as presented above and an outlet heat sink such as presented above, the inlet connector of the inlet heat sink being fluidly connected to the cooling circuit by an inlet tube, the cold outlet connector of the inlet heat sink being fluidly connected to the cold inlet connector of the outlet heat sink, the hot outlet connector of the inlet heat sink being fluidly connected to the hot inlet connector of the outlet heat sink, the outlet connector of the outlet heat sink is connected to the discharge circuit by an outlet tube.

The system according to one or more embodiments of the invention thus makes it possible to effectively cool the electronic board by distributing the cold heat transfer fluid between the inlet heat sink and the outlet heat sink of the same assembly of heat sinks. The cooling system according to at least one embodiment of the invention makes it possible to guarantee the cooling of the electronic board components, by liquid means regardless of the nature of the electronic components: the low and middle components by the cold plate and the so-called high components such as processors and memory modules by the heat sinks, in particular single-phase, with cooling block. The cooling system according to at least one embodiment of the invention, due to its structure with cooling blocks connected in flexible connections with the cooling circuit of the cold plate allows great flexibility for removing the processors and guarantees reliable connections after a large number of disassembly operation cycles. A 10 bar seal is guaranteed by the cooling system according to one or more embodiments of the invention, including after several disassembly operations. The cooling system according to at least one embodiment of the invention, due to its structure with cooling blocks connected in flexible connections with the cooling circuit of the cold plate, allows the implantation of a plurality of heat sinks in series or in parallel, for example six.

Advantageously, in at least one embodiment, the hot outlet connector of the heat sink is connected to the hot inlet connector of the outlet heat sink by a first flexible and/or straight connecting tube and the cold outlet connector of the inlet heat sink is connected to the cold inlet connector of the outlet heat sink by a second flexible and/or straight connecting tube.

In one or more embodiments, when the first connecting tube and the second connecting tube are straight, they are arranged parallel to each other in order to optimize the space and thereby reduce the volume of the system.

In at least one embodiment, the at least one assembly of heat sinks comprises an interlayer heat sink as presented above, fluidly connected on the one hand to the hot outlet connector and to the cold outlet connector of the inlet heat sink and on the other hand to the hot inlet connector and to the cold inlet connector of the outlet heat sink.

According to one or more embodiments of the invention, the system may comprise a plurality of assemblies of heat sinks, preferably arranged parallel to each other in order to optimize space and thus reduce the volume of the system.

Advantageously, in at least one embodiment, the inlet tube of each inlet heat sink is flexible in order to facilitate the assembly by flexible connections with the cold plate.

More advantageously, in at least one embodiment, the outlet tube of each outlet heat sink is flexible to facilitate the assembly by flexible connections with the cold plate.

More advantageously, in at least one embodiment, the at least one interlayer heat sink is connected to the inlet heat sink and/or the outlet heat sink via flexible and/or straight connecting tubes.

At least one embodiment of the invention also relates to a method for separating a flow of "cold" heat transfer fluid in an inlet heat sink such as presented above for a liquid cooling system of an electronic board, the board comprising at least one electronic component, for example a processor, a voltage regulator or a memory module, for example mounted on a support, the system comprising a cold plate for receiving the heat sink, the cold plate being dimensioned to cover at least part of the electronic board, in particular the support of the at least one electronic component, where applicable, and comprising a cooling circuit comprising channels inside of which a "cold" heat transfer fluid, for supplying at least the heat sink, and a discharge circuit comprising channels inside of which a "hot" heat transfer fluid having been heated through the heat sink, the method comprising the steps of supplying the cold inlet connector by the heat transfer fluid from the cold plate and dividing the incoming heat transfer fluid flow through the cold inlet connector into a first flow, which is oriented towards the lower part of the cooling block so as to collect the heat generated by the electronic board by being routed to the hot outlet connector, and a second flow, oriented directly to the cold outlet connector.

At least one embodiment of the invention also relates to a method for merging a heat transfer fluid stream into an outlet heat sink as presented above for a liquid cooling system of an electronic board, the board comprising at least one electronic component, for example a processor, a voltage regulator or a memory module, for example mounted on a support, the system comprising a cold plate for receiving the heat sink, the cold plate being dimensioned to cover at least part of the electronic board, in particular the support of the at least one electronic component, where applicable, and comprising a cooling circuit comprising channels inside of which a "cold" heat transfer fluid, for supplying the heat sink, and a discharge circuit comprising channels in which a "hot" heat transfer fluid having been heated through the heat sink, the method comprising the steps of supplying the cold inlet connector by the cold heat transfer fluid, supplying the hot inlet connector by a flow of heated heat transfer fluid, routing of the incoming heat transfer fluid through the cold inlet connector to the lower part of the cooling block so as to collect the heat generated by the electronic board by being routed to the outlet connector and routing of the heated heat transfer fluid received on the hot inlet connector directly to the outlet connector where it merges with the heated flow in the lower part of the cooling block.

At least one embodiment of the invention also relates to a method for managing a flow of heat transfer fluid in an interlayer heat sink as presented above for a liquid cooling system of an electronic board, the electronic board comprising at least one electronic component, for example a processor, a voltage regulator or a memory module, for example mounted on a support, the system comprising a cold plate for receiving the interlayer heat sink, the cold plate being dimensioned to cover at least in part the electronic board, notably the support of the at least one electronic component, where applicable, and comprising a cooling circuit comprising channels inside of which a "cold" heat transfer fluid circulates, for supplying at least the heat sink, and a discharge circuit comprising channels inside of which a "hot" heat transfer fluid having been heated through the heat sink, the method comprising the steps of:

supplying of the cold inlet connector by the heat transfer fluid from the cold plate, dividing the incoming heat transfer fluid flow by the cold inlet connector into a first flow, which is oriented towards the lower part of the cooling block so as to collect the heat generated by the electronic board by being routed to the hot outlet connector, and a second flow, oriented directly to the cold outlet connector, supplying the hot inlet connector by a flow of heated heat transfer fluid, routing of the heated heat transfer fluid flow received on the hot inlet connector directly to the hot outlet connector where it merges with the heated flow in the lower part of the cooling block.

The heat sink of the cooling system according to one or more embodiments of the invention must furthermore itself respect a space constraint defined by the size of the components (processors or others) and by the space available on the cold plates to judiciously distribute the cooling fluid.

BRIEF DESCRIPTION OF THE DRAWINGS

Further characteristics and advantages of the one or more embodiments of the invention will further appear upon reading the description that follows. This is purely illustrative and should be read in conjunction with the appended drawings in which:

FIG. 1 schematically shows a system of the prior art wherein the heat sinks are mounted in series.

FIG. 2 schematically shows a system of the prior art wherein the heat sinks are mounted in parallel.

DETAILED DESCRIPTION OF THE INVENTION

Figure 3:
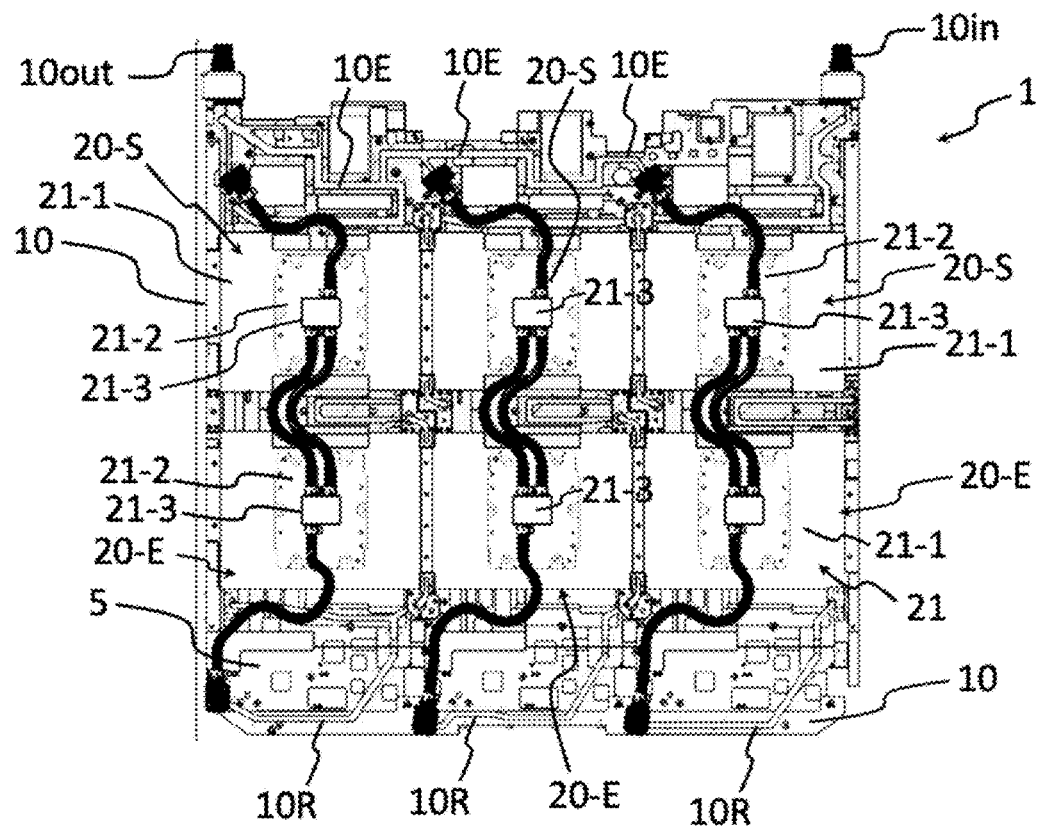
FIG. 3 schematically shows a system according to one or more embodiments of the invention.

FIG. 3 shows an example of system 1 according to one or more embodiments of the invention.

Figure 4:
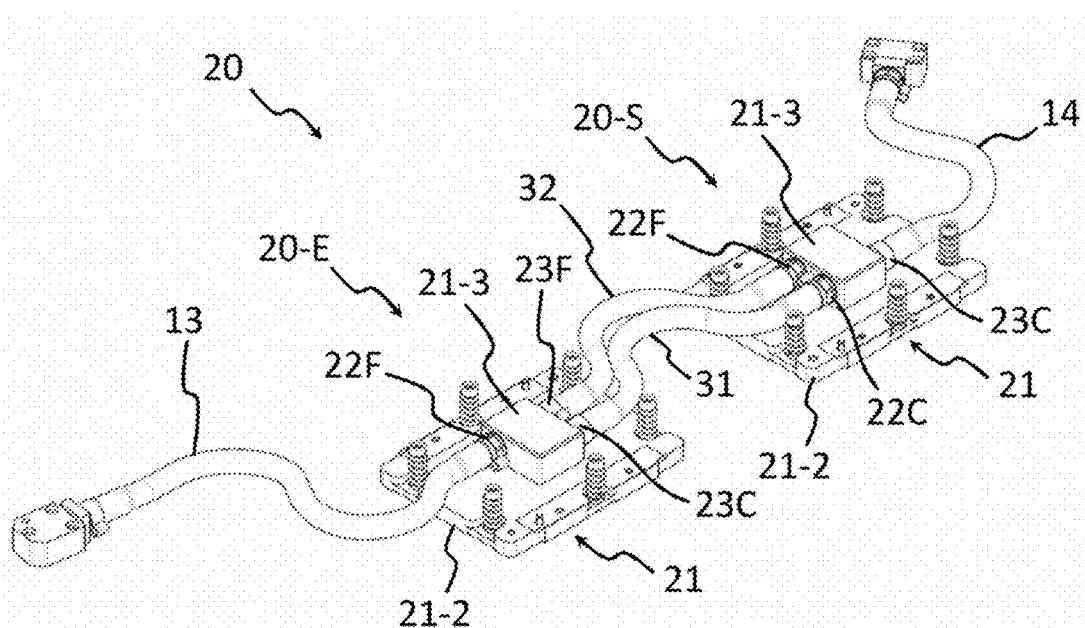
FIG. 4 schematically shows, partially, an assembly of heat sinks of the system of FIG. 3, according to one or more embodiments of the invention.

The system 1, in at least one embodiment, allows liquid cooling of an electronic board 5 (partially visible in transparency) and for this purpose comprises a cold plate 10 and assemblies 20 of heat sinks 20-E, 20-S, one of which is shown separately (and partially) in FIG. 4 by way of one or more embodiments.

In this example, in one or more embodiments, the electronic board 5 comprises six processors mounted on a support (not visible) of the electronic board 5. The electronic board 5 comprises a plurality of electronic components attached to the support, broken down for example into low and middle electronic components and high electronic components comprising the processors.

For the purposes of one or more embodiments of the invention, "low and middle electronic components" means any component of the electronic board 5 having a height below a threshold height, below which it may be cooled by the cooling circuit of the cold plate 10. For low and middle electronic components, in at least one embodiment, these are usually power supplies or voltage regulators.

For the purposes of one or more embodiments of the invention, "high electronic components" means any component of the electronic board 5 which is not cooled by the cooling circuit of the cold plate 10 because they must remain accessible without disassembly of the cold plate 10. These are electronic components that require fast maintenance such as processors or memory modules.

In the example in FIG. 3, by way of at least one embodiment, the system 1 comprises, in addition to the cold plate 10, three assemblies 20 of heat sinks 20-E, 20-S arranged parallel to each other and each comprising an inlet heat sink 20-E and an outlet heat sink 20-S.

The cold plate 10 is dimensioned to cover the processor support. In this example, by way of one or more embodiments, the cold plate 10 has external dimensions substantially equal to those of the support of the electronic board 5 so that it covers the entire support and the low and middle electronic components.

The cold plate 10 comprises a cooling circuit 10R and a discharge circuit 10E. The cooling circuit 10R comprises channels, preferably rigid, inside of which a "cold" heat transfer fluid circulates making it possible to supply the inlet heat sinks. The discharge circuit 10E comprises channels inside of which a "hot" heat transfer fluid circulates, having been heated through the heat sinks 20-E, 20-S.

The supply of cold heating fluid to the cold plate 10 is carried out via an inlet connector 10in and the outlet of the heated heating fluid from the cold plate 10 is carried out via an outlet connector 10out.

The heat sinks 20-E, 20-S may be of the single-phase type.

Each heat sink 20-E, 20-S comprises a main heat exchange zone able to bear against a high electronic component, particularly one of the processors, or a low electronic component, particularly the voltage regulators and/or memory modules.

In reference to FIG. 4, by way of one or more embodiments, each heat sink 20-E, 20-S comprises a cooling block 21, at least one inlet connector 22C, 22F, and at least one outlet connector 23C, 23F (depending on the type of heat sink 20-E, 20-S).

The cooling block 21 is made of a heat-conducting material such as, for example, aluminum or aluminum alloy.

The cooling block 21 comprises a lower part 21-1 constituting the main heat exchange zone, an intermediate "distribution" part 21-2 (optional) and an upper part 21-3 connected to the cold plate 10.

In at least one embodiment, the cooling block 21 comprises a through-slot located in the intermediate part for homogeneously distributing the flow of the heat transfer fluid from the upper part in the form of a jet centered towards a support plate located in the main heat exchange zone and comprising a hollow central part with a zone equipped with fins or pins to generate turbulence in the flow regime of the heat transfer fluid and a zone peripheral to the zone fitted with fins or pins to collect the heat transfer fluid and direct it towards the outlet connector. In at least one embodiment, the slot is thin. Thus, in this configuration, by way of one or more embodiments, the heat transfer fluid, when it arrives in the cooling block 21, passes through the thin slot, which allows it to be equally distributed in the exchange surface through the fins. The shape of this distributor and its distance from the fins are designed to obtain the largest possible Reynolds number in the available space.

Inlet Heat Sink 20-E

Still in reference to FIGS. 3 and 4, by way of one or more embodiments, each inlet heat sink 20-E comprises a "cold" inlet connector 22F, a "hot" outlet connector 23C and a "cold" outlet connector 23F.

The cold inlet connector 22F is fluidly connected to the upper part of the cooling block 21 and receives an inlet tube 13, preferably flexible, connected to the cooling circuit 10R to supply the cooling block 21 with the heat transfer fluid from the cold plate 10.

The upper part of the cooling block 21 is configured to divide the heat transfer fluid flow entering by the cold inlet connector 22F into a first flow and a second flow. In at least one embodiment, this division is carried out by implementing a Tickelman loop, known per se, at the cooling block 21.

The first flow is directed towards the lower part of the cooling block 21 so as to collect the heat generated by the electronic board 5 by being routed to the hot outlet connector 23C.

The second flow is directed directly to the cold outlet connector 23F.

Outlet Heat Sink 20-S

Each outlet heat sink 20-S comprises a "hot" inlet connector 22C, a "cold" inlet connector 22F and a "hot" outlet connector 23C.

The hot inlet connector 22C is fluidly connected to the upper part of the cooling block 21 and receives a first connecting tube 31, preferably flexible, of a heat transfer fluid flow heated by the inlet heat sink 20-E, connected to the hot outlet connector 23C of the inlet heat sink 20-E.

The cold inlet connector 22F is fluidly connected to the upper part of the cooling block 21 and receives a second, preferably flexible, connecting tube 32, connected to the cold outlet connector of the inlet heat sink 20-E, so that the cooling block 21 is supplied by the heat transfer fluid from the cold plate 10 through the inlet heat sink 20-E, in particular from the cold outlet connector 23F of the inlet heat sink 20-E.

The upper part of the cooling block 21 is configured to on the one hand route the flow of heat transfer fluid entering through the cold inlet connector 22F to the lower part of the cooling block 21 so as to collect the heat generated by the electronic board 5 by being routed to the hot outlet connector 23C, and on the other hand to route the heated heat transfer fluid received on the hot inlet connector 22C directly to the hot outlet connector 23C. In at least one embodiment, this merger is carried out by implementing a Tickelman loop, known per se, at the cooling block 21.

The hot outlet connector 23C of the outlet heat sink 20-S is connected to the discharge circuit of the cold plate by an outlet tube 14.

Figure 5:
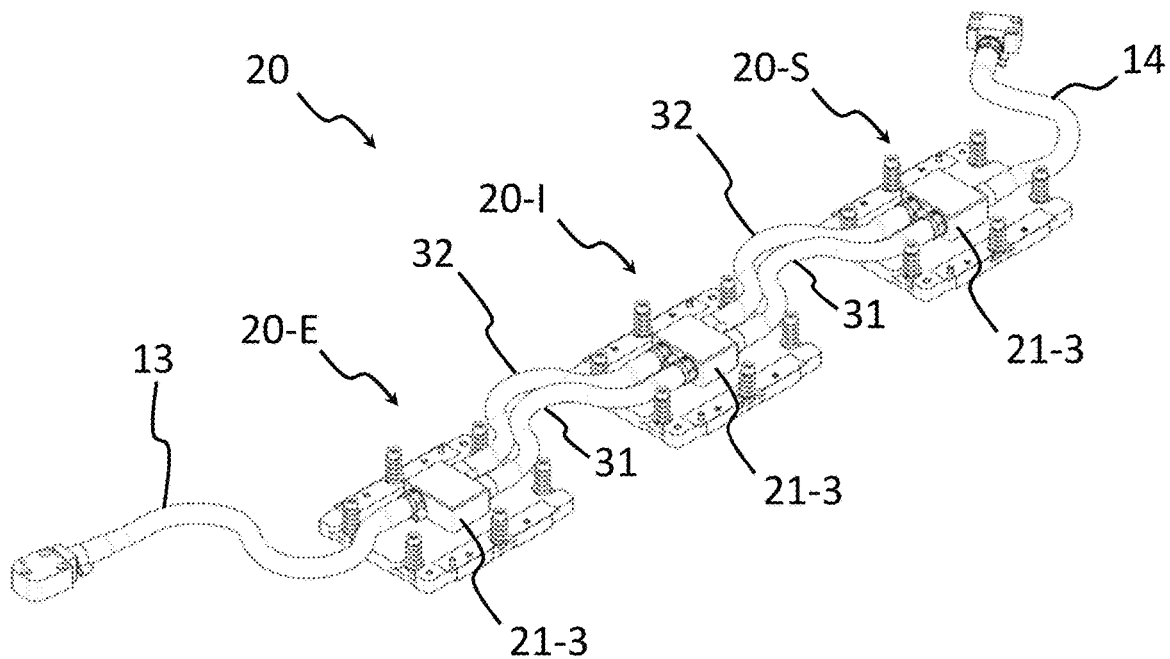
FIG. 5 schematically shows, partially, an assembly of heat sinks comprising an interlayer heat sink, according to one or more embodiments of the invention.

In at least one embodiment, shown in FIG. 5, each assembly of heat sinks further comprises an interlayer heat sink 20-I, fluidly connected on the one hand to the hot outlet connector 23C and the cold outlet connector 23F of the inlet heat sink 20-E and on the other hand to the hot inlet connector 22C and the cold inlet connector 22F of the outlet heat sink 20-S. This configuration makes it possible to cool a matrix of 3×3 (i.e. 9) processors (or more) simultaneously.

The interlayer heat sink 20-I comprises a "cold" inlet connector 22F to be fluidly connected to the cold outlet connector 23F of the inlet heat sink 20-E and fluidly connected to the upper part 21-3 of the cooling block 21 so that the cooling block 21 is supplied by the cold heat transfer fluid. The interlayer heat sink 20-I comprises a "hot" inlet connector 22C to be fluidly connected to the hot outlet connector 23C of the inlet heat sink 20-E and fluidly connected to the upper part 21-3 of the cooling block 21. The interlayer heat sink 20-I comprises a "hot" outlet connector 23C to be fluidly connected to the hot inlet connector 22C of the outlet heat sink 20-S. The interlayer heat sink 20-I comprises a "cold" outlet connector 23F to be fluidly connected to the cold inlet connector 22F of the outlet heat sink 20-S. The upper part 21-3 of the cooling block 21 is configured to divide the flow of heat transfer fluid entering through the cold inlet connector 22F into a first flow, which is oriented towards the lower part 21-1 of the cooling block 21 so as to collect the heat generated by the electronic board 5 by being routed to the hot outlet connector 23C, and a second flow, oriented directly towards the cold outlet connector 23F, and route the heated heat transfer fluid flow received on the hot inlet connector 22C directly to the hot outlet connector 23C.

In at least one embodiment, the system 1 could comprise more or less than three assemblies of heat sinks and each assembly of heat sinks could comprise, in addition to an inlet heat sink 20-E and an outlet heat sink 20-S, one or more interlayer heat sinks 20-I, connected in series.

Example of One or More Embodiments

The heat transfer fluid circulating in the cooling circuit of the cold plate, before entering the inlet heat sinks, is called "cold". The heat transfer fluid circulating in the discharge circuit of the cold plate after passing through the heat sink assemblies is called "hot".

Figure 6:
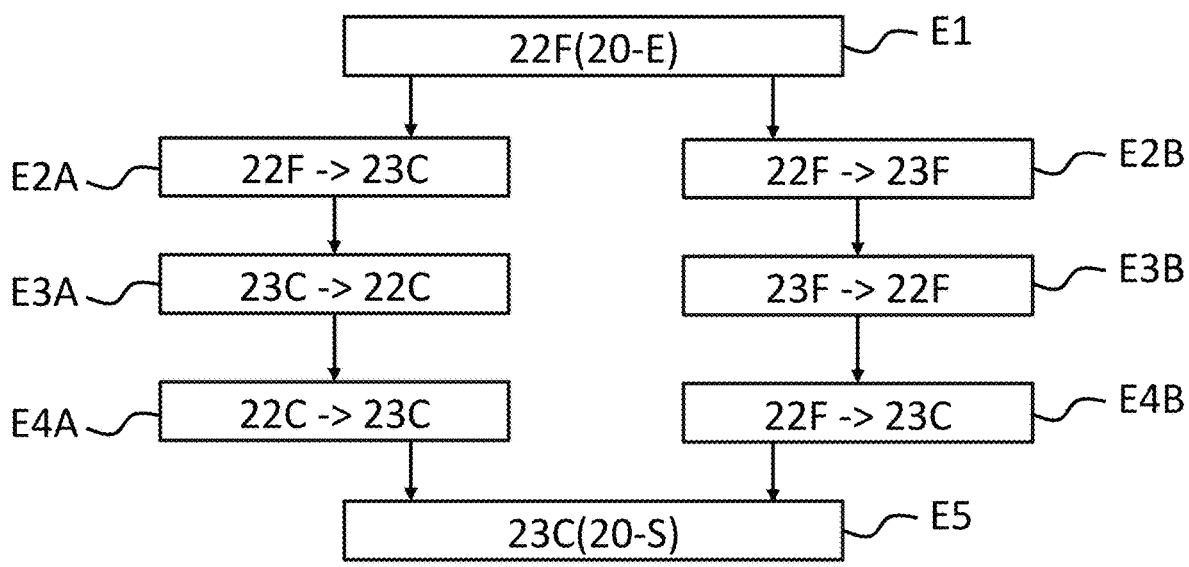
FIG. 6 schematically shows a method according one or more embodiments of to the invention.

Thus, in reference to FIG. 6, by way of one or more embodiments, in a step E1, the cold heat transfer fluid is routed through the cooling circuit to the cold inlet connector 22F of each inlet heat sink 20-E in order to supply it.

Each inlet heat sink 20-E divides the flow of cold heat transfer fluid entering through the cold inlet connector 22F into a first flow and a second flow, substantially equal in flow rate, the flow rate being about half the flow of the incoming flow.

The first flow is directed from the cold inlet connector 22F to the lower part 21-3 of the cooling block 21 in a step E2A so as to collect the heat generated by the electronic board 5 and then be routed to the hot outlet connector 23C.

The second flow is oriented in a step E2B directly to the cold outlet connector 23F without passing through the lower part 21-3 of the cooling block 21 and therefore without undergoing heating by the electronic board 5.

In a step E3A, the first heated flow is routed from the hot outlet connector 23C of the inlet heat sink 20-E to the hot inlet connector 22C of the outlet heat sink 20-S via the first connecting tube 31.

In a step E3B, the second flow, composed of cold heat transfer fluid, is routed at the inlet of the cold inlet connector 22F of the outlet heat sink 20-S.

In a step E4A, the flow of heated heat transfer fluid is transferred directly from the hot inlet connector 22C of the outlet heat sink 20-S to the hot outlet connector 23C of the outlet heat sink 20-S.

In a step E4B, the second flow is routed to the lower part 21-3 of the cooling block 21 of the outlet heat sink 20-S so as to collect the heat generated by the electronic board 5, then to the hot outlet connector 23C of the outlet heat sink 20-S where it mixes, in a step E5, with the heated heat transfer fluid flow provided by step E4A, so as to regain the initial flow rate of the inlet flow of step E1.

The one or more embodiments of the invention makes it possible to have the assemblies 20 of heat sinks 20-E, 20-S in parallel by reducing the number of inlet tubes 13 and outlet tubes 14 while allowing easy maintenance.

The invention claimed is:

1. An inlet heat sink for a liquid cooling system of an electronic board, said electronic board comprising at least one electronic component, said liquid cooling system comprising a cold plate that receives said inlet heat sink, said cold plate being dimensioned to cover at least part of said electronic board and comprising a cooling circuit comprising channels inside of which a cold heat transfer fluid flows, to supply at least said inlet heat sink, and a discharge circuit comprising channels inside of which a hot heat transfer fluid having been heated through the inlet heat sink, wherein the inlet heat sink comprises:
 a cooling block comprising a lower part constituting a main heat exchange zone and an upper part connected to the cold plate,
 a cold inlet connector fluidly connected to the upper part of said cooling block and which is to receive an inlet tube of the cooling circuit such that said cooling block is supplied by heat transfer fluid from the cold plate,
 a hot outlet connector,
 a cold outlet connector, the upper part of the cooling block being configured to divide a flow of said heat transfer fluid entering through the cold inlet connector into
  a first flow, which is oriented towards the lower part of the cooling block so as to collect heat generated by the electronic board by being routed to the hot outlet connector, and
  a second flow, oriented directly towards the cold outlet connector.

2. The inlet heat sink according to claim 1, wherein the at least one electronic component is a processor, a voltage regulator, or a memory module.

3. The inlet heat sink according to claim 1, wherein the cooling block is made of a heat-conducting material.

4. A system for liquid cooling of an electronic board, said electronic board comprising at least one electronic component, said system comprising:
 a cold plate and at least one assembly of heat sinks,
 wherein the cold plate is configured to receive said at least one assembly of heat sinks, being dimensioned to at least partially cover the electronic board, and wherein the cold plate comprises
  a cooling circuit comprising channels in which a cold heat transfer fluid circulates, to supply at least one heat sink of the at least one assembly of heat sinks, and
  a discharge circuit comprising channels inside of which a hot heat transfer fluid having been heated through at least one heat sink of the at least one assembly of heat sinks,
  wherein each heat sink of the at least one assembly of heat sinks comprises a main heat exchange zone capable of bearing against one electronic component of the at least one electronic component,
  wherein each assembly of heat sinks of the at least one assembly of heat sinks comprises an inlet heat sink and an outlet heat sink, comprising
   a cooling block comprising a lower part constituting the main heat exchange zone and an upper part to be connected to the cold plate,
   a cold inlet connector fluidly connected to the upper part of said cooling block and receiving a connecting tube of the cooling circuit such that said cooling block is supplied by heat transfer fluid from the cold plate through the inlet heat sink,
   a hot inlet connector fluidly connected to the upper part of said cooling block and which is to receive a connecting tube of a flow of heated heat transfer fluid,
   a hot outlet connector, and
   a cold outlet connector,
   wherein the upper part of the cooling block is configured to route, on one hand, a flow of heating fluid entering through the cold inlet connector to the lower part of the cooling block so as to collect heat generated by the electronic board by being routed to the hot outlet connector, and, on another hand, to route the flow of heated heating fluid that is received over the hot inlet connector directly to the hot outlet connector, the cold inlet connector of the inlet heat sink being fluidly connected to the cooling circuit by an inlet tube, the cold outlet connector of the inlet heat sink being fluidly connected to the cold inlet connector of the outlet heat sink, the hot outlet connector of the inlet heat sink being fluidly connected to the hot inlet connector of the outlet heat sink, the hot outlet connector of the outlet heat sink being connected to the discharge circuit by an outlet tube.

5. The system according to claim 4, wherein the hot outlet connector of the inlet heat sink is connected to the hot inlet connector of the outlet heat sink by one or more of a first flexible connecting tube and a straight connecting tube, and wherein the cold outlet connector of the inlet heat sink is connected to the cold inlet connector of the outlet heat sink by one or more of a second flexible connecting tube and straight connecting tube.

6. The system according to claim 4, wherein the at least one assembly of heat sinks comprises an interlayer heat sink comprising said cooling block comprising said lower part constituting the main heat exchange zone and said upper part to be connected to the cold plate, wherein the interlayer heat sink comprises said cold inlet connector fluidly connected to the cold outlet connector of the inlet heat sink and fluidly connected to the upper part of said cooling block such that said cooling block is supplied by the cold heat transfer fluid, said hot inlet connector fluidly connected to the hot outlet connector of the inlet heat sink and fluidly connected to the upper part of said cooling block, said hot outlet connector fluidly connected to the hot inlet connector of the outlet heat sink, said cold outlet connector fluidly connected to the cold inlet connector of the outlet heat sink, the upper part of the cooling block being configured to divide the flow of incoming heat transfer fluid through the cold inlet connector into a first flow, which is oriented towards the lower part of the cooling block so as to collect the heat generated by the electronic board by being routed to the hot outlet connector, and a second flow, oriented directly towards the cold outlet connector, route the flow of heated heat transfer fluid received on the hot inlet connector directly to the hot outlet connector.

7. The system according to claim 4, wherein the at least one assembly of heat sinks comprises a plurality of assemblies of heat sinks arranged parallel to each other.

8. The system according to claim 4, wherein the inlet tube of each inlet heat sink is flexible.

9. The system according to claim 4, wherein the outlet tube of each outlet heat sink is flexible.

10. A method for separating a cold heat transfer fluid stream in an inlet heat sink for a liquid cooling system of an electronic board, said electronic board comprising at least one electronic component, said liquid cooling system comprising a cold plate for receiving said inlet heat sink, said cold plate being dimensioned to cover at least in part the electronic board and comprising a cooling circuit comprising channels inside of which a cold heat transfer fluid circulates, for supplying at least said inlet heat sink, and a discharge circuit comprising channels inside of which a hot heat transfer fluid is circulating, having been heated through the inlet heat sink, wherein said inlet heat sink comprises a cooling block comprising a lower part constituting a main heat exchange zone and an upper part connected to the cold plate, a cold inlet connector fluidly connected to the upper part of said cooling block and which is to receive an inlet tube of the cooling circuit such that said cooling block is supplied by heat transfer fluid from the cold plate, a hot outlet connector, a cold outlet connector, the upper part of the cooling block being configured to divide a flow of said heat transfer fluid entering through the cold inlet connector;

said method comprising:

supplying the cold inlet connector by the heat transfer fluid from the cold plate, and dividing said flow of heat transfer fluid through the cold inlet connector into a first flow, which is oriented towards the lower part of the cooling block so as to collect heat generated by the electronic board by being routed to the hot outlet connector, and a second flow, oriented directly towards the cold outlet connector.

* * * * *